(12) United States Patent
Nishiki

(10) Patent No.: US 6,558,962 B2
(45) Date of Patent: May 6, 2003

(54) METHOD OF MANUFACTURING SEMICONDUCTOR DEVICES WITH USE OF WAFER CARRIER HAVING CONDITIONING UNITS

(75) Inventor: Kazuhiro Nishiki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/067,948

(22) Filed: Feb. 8, 2002

(65) Prior Publication Data

US 2002/0155647 A1 Oct. 24, 2002

(30) Foreign Application Priority Data

Feb. 9, 2001 (JP) .......................................... 2001-034156
Mar. 5, 2001 (JP) .......................................... 2001-060581

(51) Int. Cl.[7] .............................................. H01L 21/00
(52) U.S. Cl. ............................................. 438/5; 438/908
(58) Field of Search ........................... 438/5, 7, 16, 907, 438/908, 909

(56) References Cited

U.S. PATENT DOCUMENTS 5,897,710 A * 4/1999 Sato et al. ...................... 438/5
5,944,857 A * 8/1999 Edwards et al. ............ 438/908
6,398,476 B1 * 6/2002 Ando ........................... 414/282
6,449,530 B1 * 9/2002 Yamada et al. ............. 414/940

FOREIGN PATENT DOCUMENTS

JP        10-214883       8/1998
JP        10-294251       11/1998

* cited by examiner

Primary Examiner—Chandra Chaudhari
(74) Attorney, Agent, or Firm—Oblon, Spivak, McClelland, Maier & Neustadt, P.C.

(57) ABSTRACT

A method of manufacturing semiconductor devices uses a wafer carrier having conditioning units to control internal conditions of the wafer carrier. The wafer carrier stores and carries wafers between manufacturing equipments used in manufacturing processes. For each of the manufacturing processes, the method includes placing the wafer carrier on a load port, transferring the wafers from the wafer carrier into the manufacturing equipment through the load port, changing operating conditions of the conditioning units according to the process or test being carried out by the manufacturing equipment, returning the wafers into the wafer carrier through the load port after the completion of the process or test, and operating the conditioning units according to the changed operating conditions to control the internal conditions until the wafer carrier is carried to the next manufacturing equipment.

14 Claims, 6 Drawing Sheets

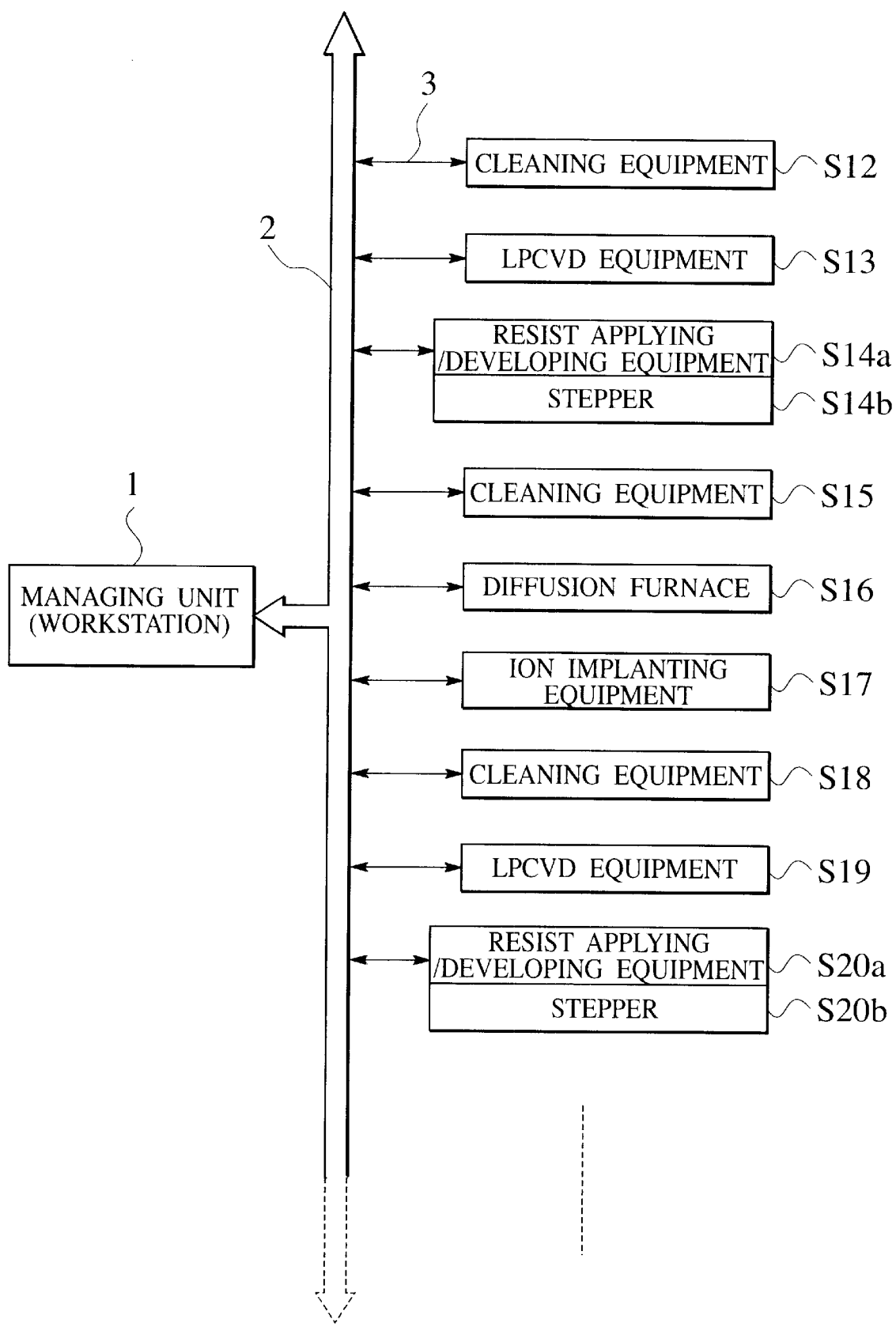

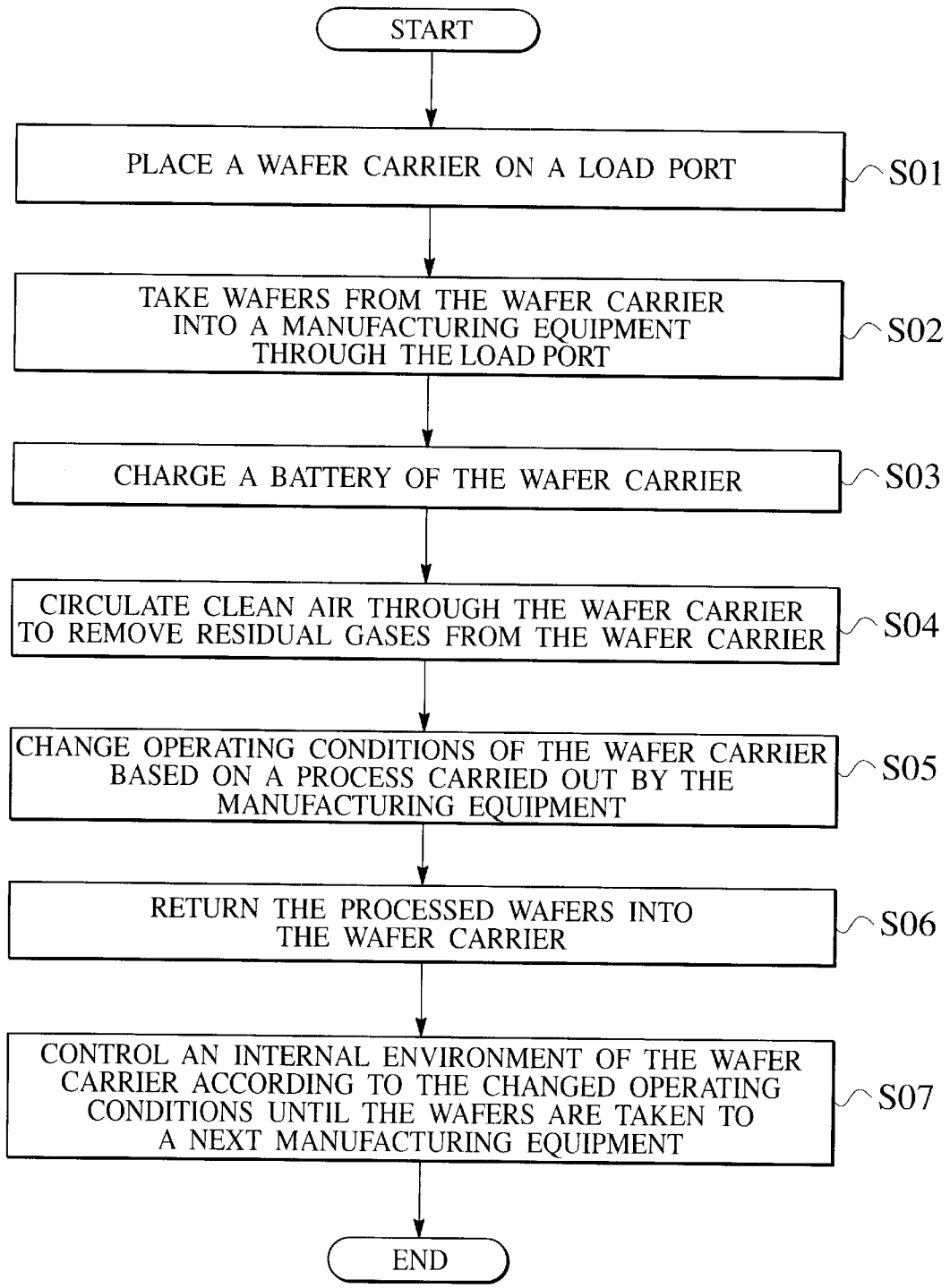

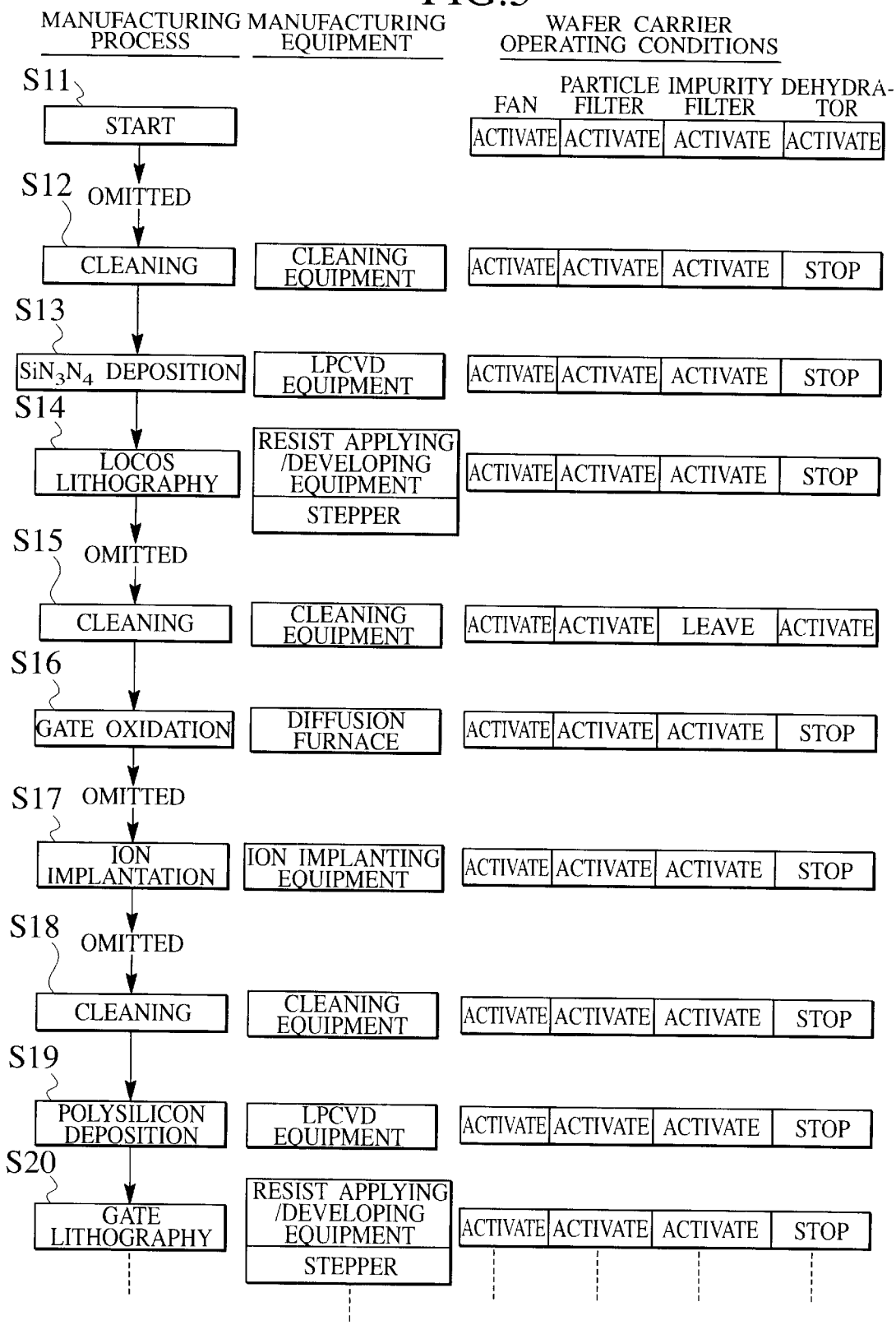

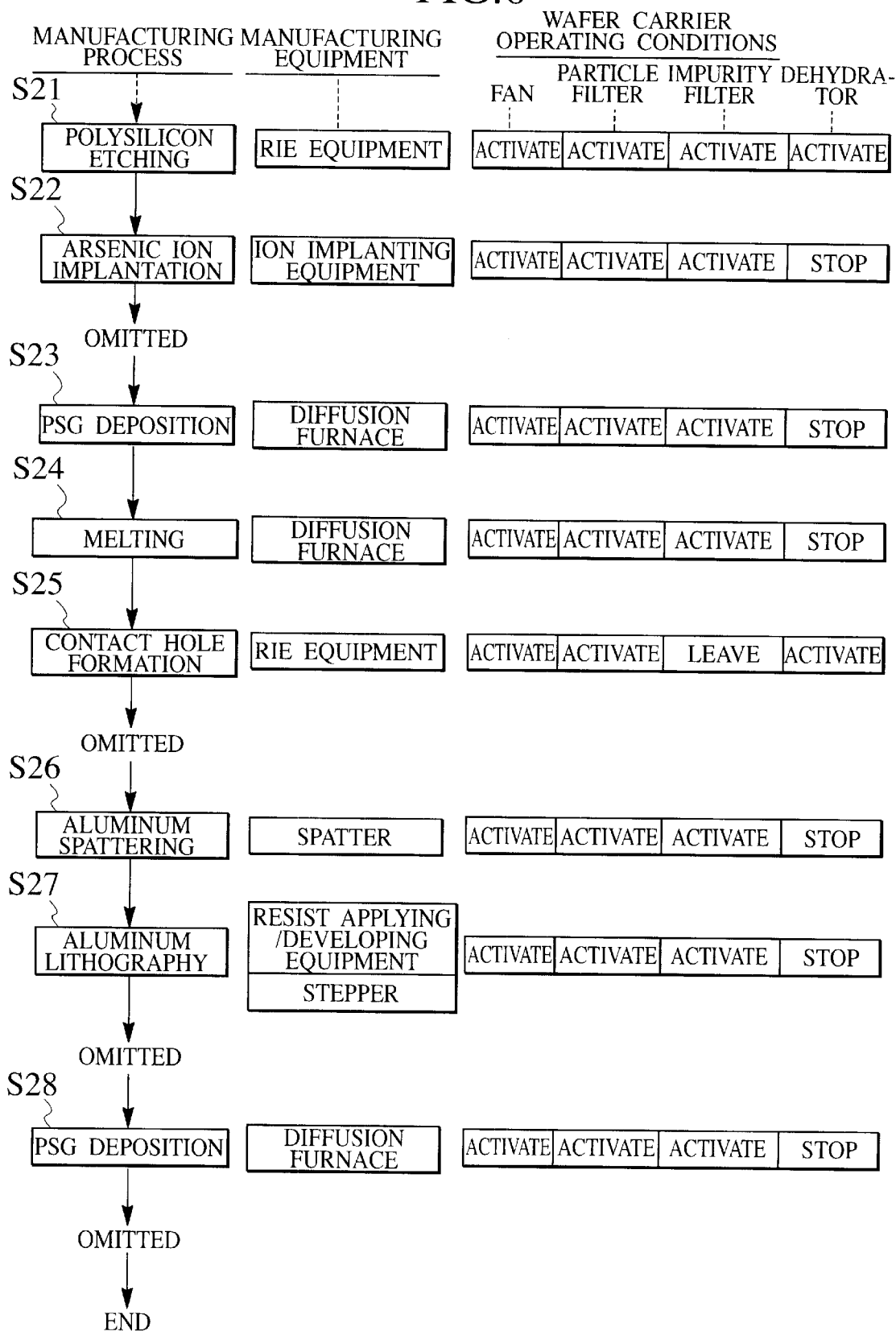

METHOD OF MANUFACTURING SEMICONDUCTOR DEVICES WITH USE OF WAFER CARRIER HAVING CONDITIONING UNITS

CROSS REFERENCE TO RELATED APPLICATIONS

This application is based upon and claims the benefit of priority from the prior Japanese Patent Applications No. P2001-34156 filed on Feb. 9, 2001 and No. P2001-60581 filed on Mar. 5, 2001, the entire contents of which are incorporated herein by reference.

BACKGROUND OF THE INVENTION

1. Field of the Invention

The present invention relates to a method of manufacturing semiconductor devices with the use of a wafer carrier having conditioning units. The wafer carrier stores in-process wafers and carries them between manufacturing equipments on a semiconductor device manufacturing line.

2. Description of the Related Art

Semiconductor devices having fine patterns are manufactured in a clean room free of dust. A clean room, however, still contains or produces impurities that affect semiconductor device manufacturing processes. Chemical filters to remove impurities from intake air are therefore employed, and other chemical filters are installed in air conditioners and air circulating systems to remove impurities produced in the clean room.

In-process wafers handled in the clean room are stored and carried in a wafer carrier to prevent dust or impurities from making contact with the wafers. Some semiconductor device manufacturing processes carried out in the clean room leave residues on the wafers which contaminate other wafers when they are stored in the wafer carrier.

To solve this problem, Japanese Patent Laid Open Publication No. 7-94577 discloses a technique of using a vapor removing element having an activated carbon absorption layer to remove chemical vapors (impurities) from a wafer carrier. Ebara Corporation has marketed a wafer carrier "Wafer Carrying Clean Box (trade name)" having a chemical filter to remove impurities and a fan to circulate air in the wafer carrier.

A semiconductor device manufacturing line includes processes that leave a large amount of residue on wafers. If wafers contaminated with the residues are stored in a wafer carrier, the residues will quickly destroy the chemical filter installed in the wafer carrier.

The wafer carriers in the related art are only capable of maintaining a single operating condition throughout a semiconductor device manufacturing line. In practice, a manufacturing line involves various processes some of which require wafers in a wafer carrier to be at low humidity, some of which require wafers in a wafer carrier to be free of impurities, and some of which require wafers in a wafer carrier both to be free of humidity and impurities. These requirements must be met to improve the quality and yield of semiconductor devices manufactured. The related art are incapable of flexibly meeting such varied requirements.

Ion-impurity removing chemical filters rapidly deteriorate in their performance when environmental humidity drops below 20%. Chemical filters remove ion impurities with difficulty in low humidity.

In this way, the semiconductor device manufacturing line involves processes having various requirements, and the chemical filters dysfunction in low humidity. To properly store and carry wafers through various processes in the semiconductor device manufacturing line in the related art, wafer carriers of different functions must be prepared and changed from one to another depending on processes. This increases the purchasing cost of the wafer carriers. In addition, vacant wafer carriers must be allocated to various semiconductor device processes depending on the characteristics of the wafer carriers and processes, increasing delivery load. These wafer carriers need large storage spaces and must be switched from one to another depending on the process, thus extending manufacturing time.

The wafer carriers require batteries to drive the fans and dehydrate the filters installed in the wafer carriers. The batteries usually last for only about $1/100$ of the semiconductor device manufacturing time, and therefore, must be recharged. Recharging is troublesome, may delay the manufacturing schedule, and needs a recharging space.

The relative humidity in a clean room is usually maintained at between 30% to 60% for the workability of workers and the performance of chemical filters. The humidity in a clean room promotes the formation of natural oxide films on wafers which corrode the metal wiring formed on the wafers.

BRIEF SUMMARY OF THE INVENTION

According to an aspect of the present invention, a method of manufacturing semiconductor devices uses a wafer carrier having conditioning units to control internal conditions of the wafer carrier. The wafer carrier stores wafers and carries them between manufacturing equipments used in a series of semiconductor device manufacturing processes. For each of the manufacturing processes, the method includes placing the wafer carrier on a load port that automatically opens and closes a lid of the wafer carrier, transferring the wafers from the wafer carrier into the manufacturing equipment through the load port, changing operating conditions of the conditioning units of the wafer carrier according to a process or test being carried out by the manufacturing equipment on the wafers, returning the wafers into the wafer carrier through the load port after the completion of the process or test, and operating the conditioning units according to the changed operating conditions controlling the internal conditions of the wafer carrier until the wafer carrier with the wafers is carried to a manufacturing equipment of the next manufacturing process.

According to another aspect of the present invention, a system of manufacturing semiconductor devices includes manufacturing equipments carrying out a process or test on wafers in a series of manufacturing processes, a wafer carrier storing the wafers and carrying them between the manufacturing equipments, and a managing unit having a memory to store a sequence of the operating conditions for the series of manufacturing processes. The wafer carrier has conditioning units controlling internal conditions of the wafer carrier, and a display displaying a operating conditions of the conditioning units. The managing unit provides instructions to specify the operating conditions of the conditioning units.

BRIEF DESCRIPTION OF THE DRAWINGS

FIG. 3 is a block diagram showing the connections between a managing unit and manufacturing equipments shown in FIGS. 5 and 6;

FIG. 4 is a flowchart showing a sequence of stages conducted in the wafer carrier at one of specific process in the method of manufacturing semiconductor devices according to an embodiment of the present invention; and FIGS. 5 and 6 are flowcharts showing exemplary operating conditions of the wafer carrier in a series of semiconductor device manufacturing processes.

DETAILED DESCRIPTION OF EMBODIMENTS

Figure 1:
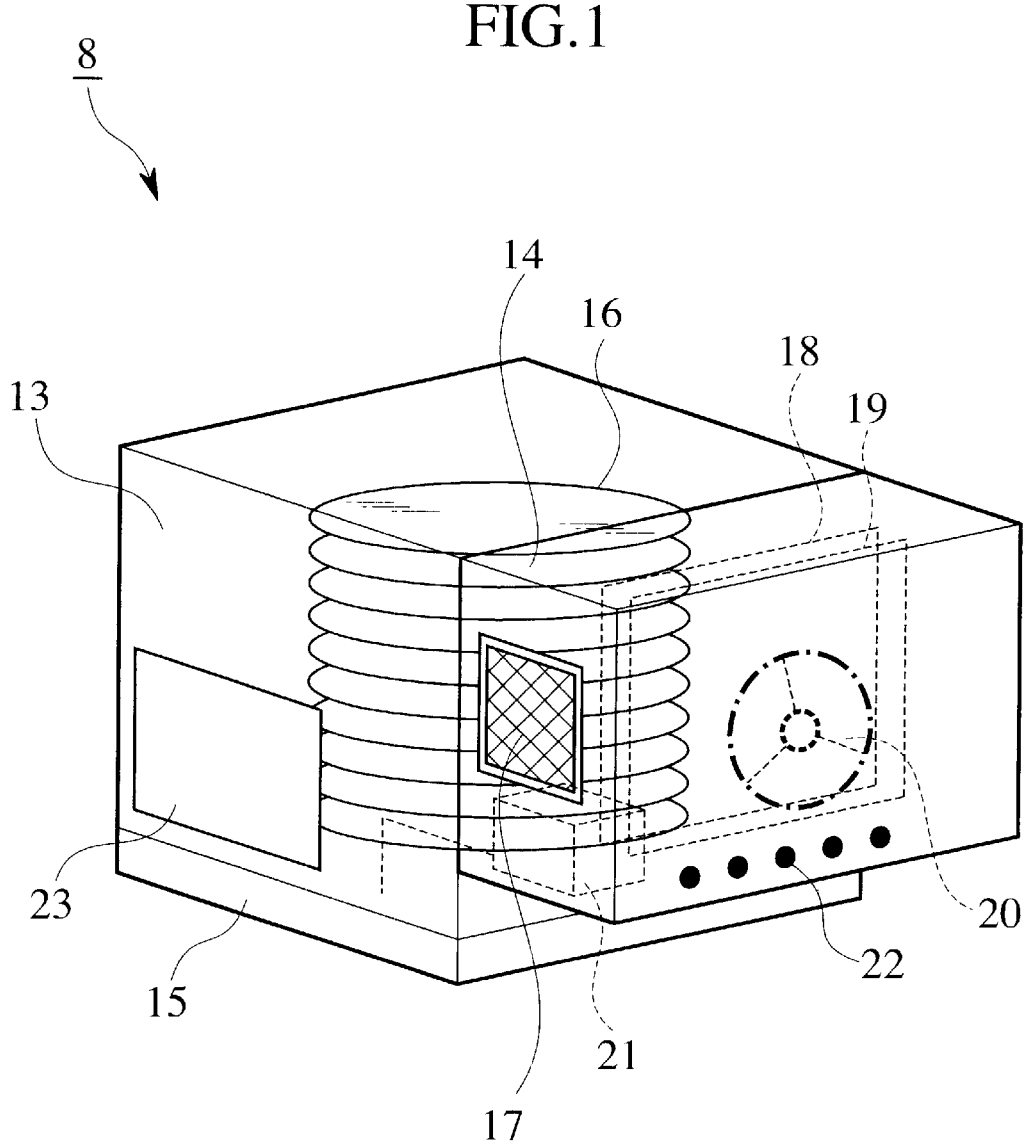
FIG. 1 is a perspective view showing an example of a wafer carrier.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Manufacturing Equipments and Wafer Carrier in Semiconductor Device Manufacturing Line)

A method of manufacturing semiconductor devices according to an embodiment of the present invention stores wafers in a wafer carrier having conditioning units and transports the wafer carrier with the wafers between semiconductor device manufacturing equipments, each corresponding to one of sequence of semiconductor device manufacturing processes. First, the wafer carrier and semiconductor device manufacturing equipments related to the method will be explained.

The wafer carrier stores in-process wafers and is carried while containing the wafers. The wafer carrier has conditioning units that are operable under different operating conditions suited to processes or tests carried out by the manufacturing equipments. By properly operating the conditioning units, the wafer carrier can protect wafers stored therein from a clean room environment and can carry the wafers in conditions appropriate for individual processes and tests achieved by manufacturing equipments.

In FIG. 1, the wafer carrier 8 includes a standard mechanical interface (SMIF) pod 13, a bottom lid 15, and a clean unit 14. The SMIF pod 13 is a plastic box. The SMIF pod 13 is laid on the bottom lid 15 to form a closed space to store wafers 16. In FIG. 1, the wafer carrier 8 is one of a configuration to store horizontally stacked wafers. The wafer carrier 8 may be implemented by another configuration to store wafers, which are vertically oriented.

The clean unit 14 has conditioning units 17 to 20 which control the internal conditions of the wafer carrier 8. The conditioning units 17 to 20 are a dehydrator 17, a particle filter 18, an impurity filter 19, and a fan 20.

The dehydrator 17 removes humidity from the wafer carrier 8. The dehydrator 17 is used to fill the wafer carrier 8 with inert gas or dry air. The dehydrator 17 may employ a polymeric solid electrolytic film to decompose water in the wafer carrier 8, as disclosed in Japanese Patent Laid Open Publication No. 2000-107550. This disclosure proposes a humidity adjusting-sensor element. In FIG. 1, the dehydrator 17 is composed of two dehydrating elements that are individually controlled. For example, the two dehydrating elements are continuously operated, or one is continuously operated and the other is operated intermittently, or one is continuously operated and the other is stopped, or both are stopped.

The particle filter 18 removes dust and particles from the wafer carrier 8. The particle filter 18 may be an unwoven fabric filter or a high efficiency particulate air (HEPA) or ultra low penetration air (ULPA) filter employing membrane filters such as polytetrafluoro ethylene (PTFE) filters and polyethylene filters.

The impurity filter 19 may be a chemical filter or an activated carbon filter. The chemical filter removes ion impurities and rapidly deteriorates its performance if environmental humidity drops below 20%. This is because the chemical filter needs water to achieve an ion exchange reaction to dissociate ion impurities.

Impurities removable with the impurity filter 19 include chlorine (Cl), fluorine (F), ammonia, dioctyl phthalate (DOP) emitted from HEPA or ULPA filters, cyclic siloxane emitted from silicon sealants, phosphoric esters used as fire retardants in the clean room, and organic solvents used in a lithography process. The wafer carrier 8 is usually made of polypropylene or polycarbonate resin which may contain unreacted monomers and oligomers (aliphatic hydrocarbon in the case of polypropylene). The impurity filter 19 can remove such unreacted components if they drift in the wafer carrier 8. The wafer carrier 8 contains plastic additives such as antioxidants, plasticizers, cross-linkers. The impurity filter 19 can remove such plastic additives if they drift in the wafer carrier 8. The plastic additives include dibutyl phthalate (DBP) and butylated hydroxytoluene (BHT) that are easily adsorbed by the wafers 16 in the wafer carrier 8.

The fan 20 circulates clean air from the clean room through the wafer carrier 8 to remove residual gases such as process gasses and wafer outgases, from the wafer carrier 8. The fan 20 may be set to a normal operation or an energy saving operation such as an intermittent operation or a low-speed operation.

The clean unit 14 also includes a clean unit controller (CPU) 21 to individually control the conditioning units 17 to 20, a battery 22 to supply power to drive the conditioning units 17 to 20, and a display (tag) 23. In response to external signals, the CPU 21 changes the operating conditions of the conditioning units 17 to 20, to establish an optimum environment for the wafers 16 depending on the nature of the process or test carried out on the wafers 16. The CPU 21 has a memory to temporarily store the external signals.

The battery 22 supplies power to drive the dehydrator 17, fan 20, CPU 21, tag 23. Generally, the capacity of the battery 22 is insufficient to continuously drive the conditioning units 17 to 20, through a series of semiconductor device manufacturing processes. The battery 22, therefore, is charged while the wafer carrier 8 is set on a load port of a manufacturing equipment. The load port will be explained later with reference to FIGS. 2A and 2B.

The tag 23 displays the operating conditions of the conditioning units 17 to 20, the internal conditions of the wafer carrier 8, the manufacturing process presently being carried out, the manufacturing process to be carried out next. Workers may monitor the information displayed on the tag 23 and handle the wafer carrier 8 accordingly. The tag 23 may be used to alert workers to an abnormality that has occurred in the wafer carrier 8. The tag 23 may display ways to control the wafer carrier 8, so that workers may catch the operating conditions of the wafer carrier 8 in time and cope with operation errors or trouble in the clean unit 14.

Figure 2A:
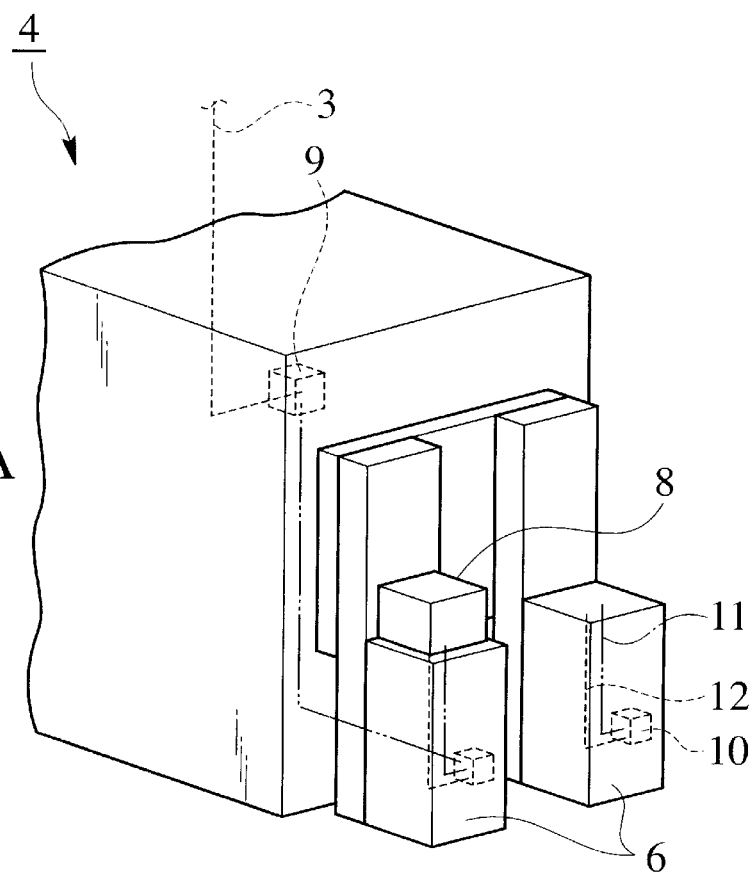
FIG. 2A shows a dry etching equipment as an example of a semiconductor device manufacturing equipment having an externally attached SMIF load port on which the wafer carrier is placed.
Figure 2B:
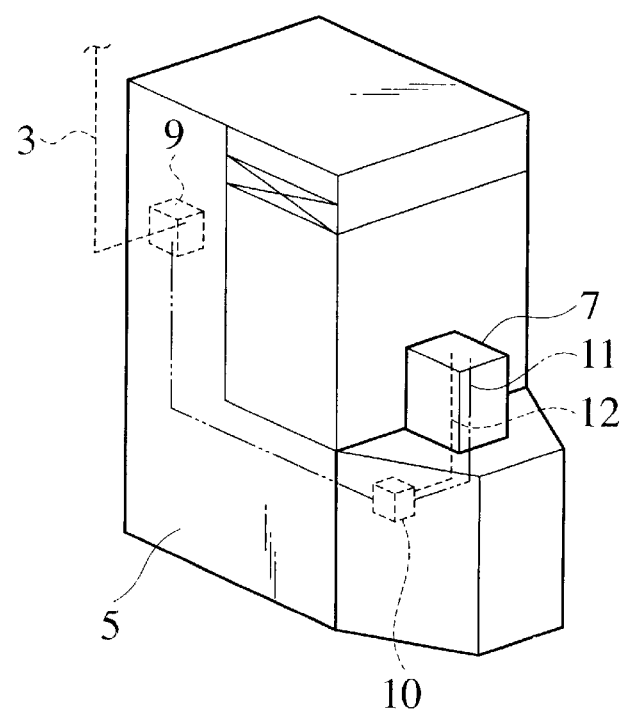
FIG. 2B shows a resist removing equipment as an example of a semiconductor device manufacturing equipment incorporating an SMIF load port on which the wafer carrier is placed.

Shown in FIG. 2A is dry etching equipment 4 to which an SMIF load port 6 is attached. Shown in FIG. 2B is a resist removing equipment 5 incorporating an SMIF load port 7. The load port 6 (7) automatically opens and closes the bottom lid 15 of the wafer carrier 8 and loads and unloads the wafers 16 between the wafer carrier 8 and the manufacturing equipment 4 (5). The load port 6 (7) may not directly be connected to the manufacturing equipment 4 (5) but may be a structure to simply open and close the lid 15. In FIGS. 2A and 2B, the manufacturing equipments 4 and 5 and load ports 6 and 7 incorporate equipment controllers 9, signal/charge controllers 10, signal lines, and I/O interfaces. These components may be externally attached to the manufacturing equipments 4 and 5 and load ports 6 and 7.

The load port 6 (7) has a function of charging the battery 22 of the clean unit 14 of the wafer carrier 8 and a function of transmitting signals to the CPU 21 to control the operating conditions of the conditioning units 17 to 20. The dry etching equipment 4 and resist removing equipment 5 are examples of the manufacturing equipments used in the sequence of semiconductor device manufacturing processes. The embodiment of the present invention is applicable to any semiconductor device manufacturing equipment and any external or incorporated load port.

In FIG. 2A, the wafer carrier 8 is placed on the external load port 6. The load port 6 is arranged at an entrance of the dry etching equipment 4. The load port 6 moves the SMIF pod 13 or lid 15 of the wafer carrier 8, takes up the wafers 16 in the wafer carrier 8, and transfers the wafers 16 into the dry etching equipment 4. After the completion of an etching operation in the equipment 4, the load port 6 transfers the wafers 16 from the equipment 4 into the wafer carrier 8.

The load port 6 has a wafer-carrier signal line 11 and a charge line 12. When the wafer carrier 8 is placed on the load port 6, the wafer carrier 8 is connected to the wafer-carrier signal lines 11 and the charge line 12. The wafer-carrier signal line 11 transfers signals related to the operating conditions of the conditioning units 17 to 20 of the wafer carrier 8. The charge line 12 is used to charge the battery 22 of the wafer carrier 8.

The wafer-carrier signal lines 11 and the charge line 12 are connected to the signal/charge controller 10 in the load port 6. The wafer-carrier signal line 11 is connected to the equipment controller 9 of the dry etching equipment 4. The equipment controller 9 is connected to the equipment signal line 3. Instead of employing the equipment signal lines 3 and the wafer-carrier signal line 11 to transfer signals, the equipment controllers 9 and the signal/charge controller 10 may employ radio signals. For example, it is possible to employ Smart Tag (trade name) of ASYST corporation. The Smart Tag is a tag dedicated to an SMIF pod and sends operating conditions to the wafer carrier 8.

In FIG. 2B, the wafer carrier 8 is placed on the load port 7 incorporated in the resist removing equipment 5 and is connected to a wafer-carrier signal line 11 and a charge line 12. The wafer-carrier signal lines 11 and the charge 12 are connected to the signal/charge controller 10 of the load port 7. The wafer-carrier signal line 11 is connected to the equipment signal line 3 through the equipment controller 9.

In FIG. 3, the equipment signal lines 3 of the equipments 4 and 5 are connected to a main signal line 2, which is connected to the workstation 1 that controls the semiconductor device manufacturing line involving a series of semiconductor device manufacturing processes carried out in a clean room. The manufacturing equipments include not only the dry etching equipment 4 and resist removing equipment 5 but also wafer processing equipments including a stepper and an ion implanting equipment and wafer testing equipments such as a wafer tester and an appearance inspector.

(Method of Manufacturing Semiconductor Devices)

In FIG. 4, a sequence of stages in which in-process wafers (16) are stored in and carried with the wafer carrier 8 by labeling stages S01 to S07 is explained.

(1) In stage S01, the wafer carrier 8 is placed on a load port of a manufacturing equipment such as the load port 6 externally attached to the manufacturing equipment 4 (FIG. 2A) or the load port 7 incorporated in the manufacturing equipment 5 (FIG. 2B).

(2) In stage S02, the wafers 16 in the wafer carrier 8 are transferred to the manufacturing equipments (4, 5) through the load port (6, 7). More precisely, the load port (6, 7) opens the bottom lid 15 of the wafer carrier 8, takes the wafers 16 out of the wafer carrier 8, and loads the wafers 16 in the manufacturing equipment (4, 5).

(3) In stage S03, the wafer carrier 8 is on the load pod (6, 7). During this time, the battery 22 of the clean unit 14 of the wafer carrier 8 is charged through the charge line 12 of the load port (6, 7). The load port (6, 7) detects the charged ratio of the battery 22, and if it is less than 80%, charges the battery 22. This charging operation makes charging work easier, avoids the delay in the manufacturing schedule, and requires no additional charging space. Stage S03 may be started after stage S01 in parallel with or before stage S02.

(4) In stage S04, the wafers 16 are processed or tested in the manufacturing equipment (4, 5). During this time, the fan 20 is operated to circulate clean air through the wafer carrier 8 and remove residual gases from the wafer carrier 8. Namely, after the wafers 16 are transferred to the manufacturing equipment (4, 5), residual gases on the inner wall of the wafer carrier 8 are removed, so that the wafers 16 returned into the wafer carrier 8 are not contaminated with the residual gases. Just before the processed or tested wafers 16 are returned to the wafer carrier 8, the fan 20 is stopped in response to an ON/OFF signal transmitted through the wafer-carrier signal line 11. This ON/OFF signal is sent from the managing unit 1 through the main signal line 2 and the equipment signal line 3.

(5) In stage S05, the wafers 16 are processed or tested in the manufacturing equipment (4, 5). During this time, the operating conditions of the conditioning units 17 to 20 of the wafer carrier 8 are changed according to the process or test carried out in the manufacturing equipment (4, 5). More precisely, signals to instruct the operating conditions of the dehydrator 17, particle filter 18, and impurity filter 19 are transmitted to the clean unit controller 21 of the wafer carrier 8 through the signal line 11 of the load port (6, 7). According to the operating conditions, the controller 21 controls these conditioning units. The instruction signals are sent from the managing unit 1 through the main signal line 2 and the equipment signal line 3.

The operating conditions of the conditioning units 17 to 20 may be changed while the wafer carrier 8 is placed on the load port (6, 7), or while the wafers 16 in the wafer carrier 8 are transferred to the manufacturing equipment (4, 5) through the load port (6, 7).

(6) In stage S06, the manufacturing equipment (4, 5) completes the processing or testing of the wafers 16, and the wafers 16 are returned into the wafer carrier 8 through the load port (6, 7).

(7) In stage S07, the wafer carrier 8 is carried to a manufacturing equipment of the next manufacturing process. During transportation and until the wafers 16 are loaded in the next manufacturing equipment, the conditioning units 17 to 20 are operated according to the operating conditions set in stage S05, to control the internal environment of the wafer carrier 8.

In FIGS. 5 and 6, the left column shows a sequence of the semiconductor device manufacturing processes, the middle column shows corresponding manufacturing equipments used in the respective processes, and the right column shows the operating conditions of the wafer carrier 8 that change according to the process or test executed by the manufacturing equipments. More precisely, the right column shows the operating conditions of the dehydrator 17, particle filter 18, impurity filter 19, and fan 20, establishing optimum environments for the wafers 16 processed and tested by the manufacturing equipments.

(1) In stage S11 of FIG. 5, the wafer carrier 8 is put into a semiconductor device manufacturing line configure to implement a sequence of the semiconductor device manufacturing processes shown in FIGS. 5 and 6. The managing unit 1 sends a signal to the wafer carrier 8 to activate all of the conditioning units 17 to 20. In stage S12, the wafers 16 are cleaned, and a signal is sent to stop the dehydrator 17. The dehydrator 17 is stopped because dehydration after the cleaning of the wafers 16 is ineffective, and therefore, the dehydrator 17 is stopped to save the power of the battery 22. In stage S13, an LPCVD equipment is employed to deposit silicon nitride ($Si_3N_4$) films on the wafers 16. In stage S14, a resist applying/developing equipment and a stepper are employed to carry out a lithography process required to delineate the $Si_3N_4$ film so as to form anti-oxidation mask to provide LOCOS films on the wafers 16. The operating conditions of the conditioning units 17 to 20 in stages S13 and S14 are the same as those of stage S12, and therefore, the same signals are sent to the wafer carrier 8.

(2) Though intervening stages between stages S14 and S15 associates with the LOCOS process are omitted, In stage S15, a cleaning process is again carried out. After the completion of the cleaning process until the next process of forming gate oxide films, the wafers 16 must not grow natural oxide films. Namely, a low humidity environment must be maintained. During the cleaning process, a signal is sent to the wafer carrier 8 to operate the dehydrator 17. Due to decreased humidity, the performance of the impurity filter 19 may deteriorate. However, higher priority is given to the prevention of natural oxide film growth than to the removal of impurities. In stage S16, a diffusion furnace is employed to form gate oxide films on the wafers 16. During this process, a signal is sent to the wafer carrier 8 to stop the dehydrator 17. This secures the necessary humidity for operating the impurity filter 19.

(3) Though intervening stages between stages S16 and S17 are omitted, stage S17 performs an ion implanting process. And after removing implantation mask employed in stage S17, S18 performs a cleaning process, S19 a polysilicon depositing process, and S20 a gate electrode lithography process. Through these stages, the operating conditions of the conditioning units 17 to 20 are unchanged. After the cleaning process of stage S18 before the deposition process of stage S19, it is important to stop the dehydrator 17 and maximize the performance of the impurity filter 19 to prevent the wafers 16 from adsorbing organic matter. If the wafers 16 adsorb organic matter, the quality of films deposited on the wafers 16 in stage S19 will deteriorate.

(4) In stage S21 of FIG. 6, using etching mask delineated by stage S20, an RIE etching process is carried out to etch the polysilicon films and form gate electrode patterns on the wafers 16. After the etching process, the wafers 16 retain residual RIE etching gases and are returned into the wafer carrier 8. If the impurity filter 19 is operated under this state, the residual etching gases will destroy the impurity filter 19. To avoid this, the fan 20 must be stopped. During the RIE etching process, a signal is sent to the wafer carrier 8 to stop the fan 20. At the same time, signals are sent to the wafer carrier 8 to stop the particle filter 18 and impurity filter 19 and to start the dehydrator 17.

(5) After removing the etching mask employed in stage S21, and further the surface of polysilicon has been undertaken the cleaning treatment, in stage S22, an arsenic ion implanting process is carried out in an ion implanting equipment with the polysilicon gate electrodes serving as masks, to form diffusion regions such as source and drain regions on the wafers 16. The residual etching gases produced in stage S21 on the wafers 16 may adhere to the inner wall of the wafer carrier 8. If the wafers 16 with diffusion regions formed thereon are returned to the wafer carrier 8, the etching gases on the inner wall of the wafer carrier 8 may contaminate the wafers 16. To avoid this, signals are sent to the wafer carrier 8 during the ion implanting process, to start the fan 20 and stop the dehydrator 17. This increases humidity in the wafer carrier 8 improving the performance of the impurity filter 19. The fan 20 and impurity filter 19 remove the etching gases from the inner wall of the wafer carrier 8 and prevent the contamination of the wafers 16.

(6) After the omitted several stages such as annealing process to activate the implanted arsenic ions, in stage S23, a phospho-silicate glass (PSG) depositing process is carried out in a diffusion furnace to deposit phosphorus-doped silicon oxide ($SiO_2$) films on the wafers 16. The wafers 16 with the deposited PSG films produce phosphorus outgases, which must be sufficiently removed. To achieve this, instructions are provided to the wafer carrier 8, to stop the dehydrator 17 and improve the adsorption efficiency of the impurity filter 19. In stage S24, a PSG film melting process is carried out. During this process, a signal is sent to the wafer carrier 8 to stop the dehydrator 17, saving the power of the battery 22.

(7) In stage S25, a contact hole forming process to form etching mask by lithography process is carried out. Then using the etching mask in the REE equipment, contact holes are cut in the PSG films to expose a part of the surface of semiconductor substrates or the surface of the wafers 16. The exposed substrates in the contact holes may form natural oxide films, increasing contact resistance. To prevent this, the wafers 16 with contact holes must be kept in low humidity. During the contact hole forming process, a signal is sent to the wafer carrier 8 to start the dehydrator 17 to decrease humidity. Although the performance of the impurity filter 19 deteriorates due to the decrease in humidity, the priority is given to the dehydration rather than the impurity removal.

(8) In stages S26 and S27, an Al film spattering process and an Al patterning process to form wiring layers on the wafers 16 using the lithography process and the RIE process are sequentially carried out. And after omitted several stages, in the stage S28 a PSG film depositing process is conducted to form PSG films on the Al wiring layers serving as the passivation film. During these processes, the fan 20, particle filter 18, and impurity filter 19 are activated, and the dehydrator 17 is stopped. These operating conditions are intended to properly maintain humidity in the wafer carrier 8 and sufficiently increase the performance of the impurity filter 19.

In FIG. 3, the managing unit 1 employs the main signal line 2 and equipment signal lines 3 to send signals to the manufacturing equipments to instruct the operating conditions of the wafer carrier 8. The managing unit 1 stores the proper operating conditions of the wafer carrier 8 for each of the manufacturing equipment used in the series of semiconductor device manufacturing processes. Operating conditions of the conditioning units 17 to 20 for a given manufacturing equipment are sent from the managing unit 1 to the load port of the manufacturing equipment. Namely, workers in each manufacturing process are not required to input the operating conditions of the conditioning units 17 to 20 for the manufacturing equipment used in the manufacturing process. This prevents erroneous operation of the conditioning units 17 to 20 and manufactures reliable semiconductor devices. In FIG. 3, the managing unit 1 provides the wafer carrier 8 on a load port of a given manufacturing equipment with instructions through the main signal line 2 and equipment signal lines 3 and the load port. Load ports of the manufacturing equipments may be connected to a LAN, and a workstation connected to the LAN may provide the wafer carrier 8 with instructions through the LAN and load ports. Alternatively, the load ports may directly be connected to a LAN by bypassing the manufacturing equipments, and the managing unit 1 may provide the wafer carrier 8 with instructions through the LAN and load ports.

As explained above, the embodiment transmits instruction signals to the wafer carrier 8 through a load port (6, 7) of a given manufacturing equipment, thus changing the operating conditions of the conditioning units 17 to 20 of the wafer carrier 8 according to the process or test being carried out by the manufacturing equipment.

Namely, the embodiment individually controls the operating conditions of the dehydrator 17, particle filter 18, impurity filter 19, and fan 20 of the wafer carrier 8, to control humidity in the wafer carrier 8 and remove chlorine (Cl), fluorine (F), ammonia, dust, particles, process gases, outgases, from the wafer carrier 8.

The embodiment establishes an optimum environment for in-process wafers in the wafer carrier 8 depending on the process or test to be undertaken by a given manufacturing equipment. The single wafer carrier 8 is capable of carrying and storing wafers in an optimum environment for a variety of manufacturing processes, thus manufacturing reliable semiconductor devices at low cost. The embodiment carries and stores in-process wafers in an optimum environment depending on the conditions of the wafers, to manufacture reliable semiconductor devices at low cost and high yield.

The embodiment eliminates the need for preparing several styles of wafer carriers, prevents the breakage of chemical filters, and minimizes production costs. Namely, the embodiment solves the problems of the wafer carriers in the related art that operate in only a single operating condition.

(Other Embodiments)

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

The embodiment mentioned above stores, in the managing unit 1, a sequence of operating conditions of the conditioning units 17 to 20 for manufacturing equipment. Based on the stored data, the managing unit 1 instructs the operating conditions of the conditioning units 17 to 20 through the load port of a given manufacturing equipment. This configuration does not limit the present invention. Such a sequence of operating conditions of the conditioning units 17 to 20 may be stored in a memory of the clean unit controller 21, so that the controller 21 may directly issue instructions to specify the operating conditions of the conditioning units 17 to 20. This eliminates instruction transmission and reception processes between the managing unit 1 and the individual manufacturing equipments. Workers are not required to determine or enter operating conditions for each of the conditioning units 17 to 20. This prevents erroneous operation of the wafer carrier 8 and produces reliable semiconductor devices.

The managing unit 1 may measure the remaining power of the battery 22, and instruct the wafer carrier 8 about the operating conditions of the fan 20 and dehydrator 17 according to the remaining power of the battery 22 and a present manufacturing process. The managing unit 1 may employ a database of, for example, average intervals between manufacturing processes. The managing unit 1, therefore, instruct the wafer carrier 8 to carry out an energy saving operation such as an intermittent or low-speed operation of the fan 20 and an intermittent or partial operation of the dehydrator 17. This elongates the service life of the battery 22 to accurately control the conditioning units 17 to 20.

The clean unit controller 21 may have a function of continuously or periodically checking the remaining power of the battery 22 and a function of changing the operating conditions of the conditioning units 17 to 20 accordingly. This removes statistical errors in semiconductor device manufacturing and reliably prevents the power shortage of the battery 22.

The wafer carrier 8 may have a humidity sensor to provide a humidity signal to a load port (6, 7) of a manufacturing equipment while the wafer carrier 8 is on the load port (6, 7). The SMIF pod 13 and bottom lid 15 of the wafer carrier 8 are made of plastics having water retention characteristics. The wafer carrier 8, therefore, internally discharges water depending on conditions. The operating conditions of the wafer carrier 8 change the water discharging characteristics of the SMIF pod 13 and bottom lid 15 of the wafer carrier 8. Accordingly, it would be impossible to maintain a constant humidity in the wafer carrier 8 if the operating conditions of the dehydrator 17 are fixed at a certain intermittent or partial operation. The humidity sensor provided for the wafer carrier 8 continuously or periodically measures the humidity of the wafer carrier 8, so that the clean unit controller 21 may change the operating conditions of the dehydrator 17 according to the measured humidity, to assure the required humidity in the wafer carrier 8.

The embodiment of the present invention is applicable to wafers having diameters of 200 mm, 300 mm, or any other values. The embodiment of the present invention is applicable not only to manufacturing semiconductor devices such as LSIs but also to manufacturing other electronic devices such as liquid crystal boards and photomasks (reticles) having fine patterns manufactured in a clean environment, for example, a clean room.

According to the embodiment of the present invention, the operating conditions of the conditioning units 17 to 20 may be changed whenever necessary in any manufacturing process based on the style and characteristics of semiconductor devices to manufacture, test results related to, for example, yield and failure, a final product yield, or a result of a product reliability test. Changing the operating conditions of the wafer carrier 8 for the next production lot of semiconductor devices according to such test results and yield of a present lot will cope with lot-by-lot variations and increase the final yield and reliability of semiconductor devices manufactured.

What is claimed is:

1. A method of manufacturing semiconductor devices, using a wafer carrier having conditioning units to control internal conditions of said wafer carrier, said wafer carrier storing wafers and carrying them between manufacturing equipments used in a series of manufacturing processes, the method comprising, for each of the manufacturing processes:

placing said wafer carrier on a load port that automatically opens and closes a lid of said wafer carrier;

transferring said wafers from said wafer carrier into said manufacturing equipment through said load port;

changing operating conditions of said conditioning units according to a process or test being carried out by said manufacturing equipment on said wafers;

returning said wafers into said wafer carrier through said load port after a completion of the process or test; and operating said conditioning units according to the changed operating conditions to control internal conditions of said wafer carrier until said wafer carrier with said wafers is carried to a manufacturing equipment of a next manufacturing process.

2. The method of claim 1, wherein:

said conditioning units include at least one of a dehydrator and an impurity filter, a particle filter, and a fan.

3. The method of claim 1, comprising:

circulating clean air through said wafer carrier to remove residual gases from the inside of said wafer carrier while said manufacturing equipment is carrying out the process or test on said wafers.

4. The method of claim 1, comprising:

charging a battery that supplies power to drive said conditioning units while said wafer carrier is on said load port.

5. The method of claim 4, comprising:

detecting a charged ratio of said battery, and if the detected charged ratio is below 80%, charging said battery.

6. The method of claim 1, comprising:

storing, in a managing unit, a sequence of the operating conditions of said wafer carrier for the series of manufacturing processes; and providing instructions to specify the operating conditions of said conditioning units from said managing unit.

7. The method of claim 1, comprising:

storing, in a memory of a controller that controls said conditioning units, a sequence of the operating conditions of said wafer carrier for the series of manufacturing processes; and providing instructions to specify the operating conditions of said conditioning units from said controller.

8. The method of claim 1, comprising:

displaying, on a display provided for said wafer carrier, the operating conditions of said conditioning units, an internal state of said wafer carrier, the process or test being carried out by said manufacturing equipment, and a manufacturing process to be carried out next.

9. The method of claim 2, wherein:

said particle filter is one of a high efficiency particulate air (HEPA) filter and an ultra low penetration air (ULPA) filter made of at least one of an unwoven fabric filter, a polytetrafluoro ethylene (PTFE) filter, and a polyethylene filter.

10. The method of claim 2, wherein:

said impurity filter is one of a chemical filter and an activated carbon filter.

11. The method of claim 2, wherein:

said dehydrator fills said wafer carrier with one of inert gas and dry air.

12. The method of claim 2, wherein:

said dehydrator includes a polymeric solid electrolytic film to decompose water in said wafer carrier.

13. The method of claim 2, comprising:

starting said fan, stopping said dehydrator, and starting said impurity filter, while an ion implanting process is carried out on said wafers in an ion implanting equipment.

14. The method of claim 2, comprising:

stopping said dehydrator and starting said impurity filter while an impurity-added silicon oxide film depositing process is carried out on said wafers in a diffusion furnace.

* * * * *